United States Patent
Yukikata et al.

(10) Patent No.: US 11,541,485 B2
(45) Date of Patent: Jan. 3, 2023

(54) FLUX, RESIN FLUX CORED SOLDER, AND SOLDER PASTE

(71) Applicant: KOKI Company Limited, Tokyo (JP)

(72) Inventors: Kazuhiro Yukikata, Tokyo (JP); Motohide Sasaki, Tokyo (JP)

(73) Assignee: KOKI Company Limited, Tokyo (JP)

( * ) Notice: Subject to any disclaimer, the term of this patent is extended or adjusted under 35 U.S.C. 154(b) by 17 days.

(21) Appl. No.: 16/615,466

(22) PCT Filed: Jun. 29, 2018

(86) PCT No.: PCT/JP2018/024753
§ 371 (c)(1),
(2) Date: Nov. 21, 2019

(87) PCT Pub. No.: WO2019/009191
PCT Pub. Date: Jan. 10, 2019

(65) Prior Publication Data
US 2020/0114477 A1  Apr. 16, 2020

(30) Foreign Application Priority Data
Jul. 3, 2017 (JP) .............................. JP2017-130388

(51) Int. Cl.
*B23K 35/362* (2006.01)
*B23K 35/36* (2006.01)
*H05K 3/34* (2006.01)

(52) U.S. Cl.
CPC ........ *B23K 35/362* (2013.01); *B23K 35/3601* (2013.01); *H05K 3/3489* (2013.01)

(58) Field of Classification Search
CPC .......................... B23K 35/362; B23K 35/3601
USPC ........................................... 148/23
See application file for complete search history.

(56) References Cited

U.S. PATENT DOCUMENTS

| | | | | |
|---|---|---|---|---|
| 2009/0137771 A1* | 5/2009 | Moriyama | ................ | C08F 2/50 528/380 |
| 2009/0308496 A1 | 12/2009 | Kawamata et al. | | |
| 2011/0065242 A1* | 3/2011 | Chan | .................... | H01L 21/563 257/E21.502 |
| 2014/0158254 A1 | 6/2014 | Minakuchi et al. | | |

FOREIGN PATENT DOCUMENTS

| | | |
|---|---|---|
| EP | 2 100 690 | 9/2009 |
| EP | 3495089 | 6/2019 |
| JP | 04-371391 | 12/1992 |
| JP | 06-015483 | 1/1994 |
| JP | 2001-105131 | 4/2001 |
| JP | 2015-123491 | 7/2015 |
| JP | 2017-224702 | 12/2017 |
| KR | 2009-0088359 | 8/2009 |
| WO | 2005/027601 | 3/2005 |
| WO | 2008/072654 | 6/2008 |
| WO | 2012/169459 | 12/2012 |
| WO | 2018/025798 | 2/2018 |

\* cited by examiner

*Primary Examiner* — Weiping Zhu
(74) *Attorney, Agent, or Firm* — Clark & Brody LP

(57) ABSTRACT

A flux according to the present invention includes a phosphine oxide. It is thereby possible to provide a flux capable of improving solder wettability, a resin flux cored solder including the flux, and a solder paste including the flux.

14 Claims, No Drawings

FLUX, RESIN FLUX CORED SOLDER, AND SOLDER PASTE

CROSS-REFERENCE TO RELATED APPLICATION

This application claims priority to Japanese Patent Application No. 2017-130388, the disclosure of which is incorporated herein by reference in its entirety.

FIELD

The present invention relates to a flux used for soldering, a resin flux cored solder including the flux, and a solder paste including the flux.

BACKGROUND

Examples of a solder composition used for joining electronic parts to an electronic circuit board such as a printed wiring board include a solder paste in which solder alloy powder and flux are mixed together, and a resin flux cored solder formed of a thread-shaped solder alloy inside which flux is filled. As the flux included in these solder compositions, widely used is a resin-based flux including a natural resin such as rosin or a synthetic resin, an activator, a solvent, or the like.

As a joining base material of, for example, an electronic circuit board to which electronic parts are joined, a metallic material such as copper or a copper alloy has been conventionally used since solder easily adheres to such a material. However, there has been a problem that copper and copper alloys are expensive and have poor mechanical strength. In recent years, therefore, a metallic material such as 42 Alloy (Fe-42Ni), Kovar (Fe-29Ni-17Co), or iron has been frequently used as the joining base material. These metallic materials are lower in cost and more excellent in strength but poorer in solder wettability than copper and copper alloys. Thus, in the case where a metallic material such as 42 Alloy that is difficult to be soldered (hereinafter referred to also as a hardly-joinable base material) is used, the solder wettability is improved by use of a flux including an activator including a large amount of halogen components and having high activity (Patent Literature 1).

However, there have been problems that use of a flux including a halogen-based activator having high activity is likely to cause occurrence of corrosion in a portion to be soldered, and causes emissions of harmful substances such as dioxin at the time of disposal of soldered boards. Thus, it has been required to improve the flux in terms of its composition. For example, Patent Literature 2 discloses a technique of improving solder wettability of a steel plate on which tin plating or the like is applied, using a flux including a rosin-based resin, a non-halogen-based activator, a solvent, and an amine-based compound.

CITATION LIST

Patent Literature

Patent Literature 1: JP 2001-105131 A
Patent Literature 2: JP 2015-123491 A

SUMMARY

Technical Problem

However, when soldering is performed on the hardly-joinable base material using the flux including a rosin-based resin, a non-halogen-based activator, a solvent, and an amine-based compound as disclosed in Patent Literature 2, the solder wettability cannot be sufficiently improved. Thus, further improvement of the flux composition is required.

The present invention has been conceived to solve such a problem, and it is an object of the present invention to provide a flux capable of improving solder wettability, a resin flux cored solder including the flux, and a solder paste including the flux.

Solution to Problem

A flux according to the present invention includes a phosphine oxide.

It is preferable that the flux according to the present invention further include at least one of a rosin-based resin and a synthetic resin.

It is preferable that the flux according to the present invention further include an organic acid-based activator.

In the flux according to the present invention, it is preferable that the content of the phosphine oxide be 0.1 to 10 parts by weight based on 100 parts by weight of a total of the flux.

In the flux according to the present invention, it is preferable that the phosphine oxide be triphenylphosphine oxide.

It is preferable that the flux according to the present invention further include an amine-based compound.

In the flux according to the present invention, it is preferable that the content of the amine-based compound be 0.5 to 10 parts by weight based on 100 parts by weight of the total of the flux.

In the flux according to the present invention, it is preferable that the amine-based compound have a cyclic structure.

In the flux according to the present invention, it is preferable that the amine-based compound be an imidazole-based compound.

A resin flux cored solder according to the present invention includes the flux.

A solder paste according to the present invention includes the flux.

DESCRIPTION OF EMBODIMENTS

Hereinafter, a flux, a resin flux cored solder including the flux, and a solder paste including the flux according to an embodiment of the present invention will be described.

<Flux>

The flux according to this embodiment is used for soldering and includes a phosphine oxide.

The phosphine oxide refers to a phosphorus compound having a double bond between phosphorus atoms and oxygen atoms ($P=O$ bond). Examples of the phosphine oxide include triphenylphosphine oxide, phenylbis(2,4,6-trimethylbenzoyl)phosphine oxide, diphenyl(2,4,6-trimethylbenzoyl)phosphine oxide, and tri-n-octylphosphine oxide. Among these, triphenylphosphine oxide is preferable in terms of improving solder wettability. These may be individually used, or two or more of them may be used in combination.

The content of the phosphine oxide is preferably 0.1 to 10 parts by weight based on 100 parts by weight of the total of the flux, in terms of improving solder wettability. The content of the phosphine oxide is more preferably 0.5 parts by weight or more, and more preferably 7 parts by weight or less. In the case where two or more phosphine oxides are included, the content means the total content of the phosphine oxides.

The flux according to this embodiment includes a phosphine oxide, and can thereby improve solder wettability not only for metallic materials to which solder easily adheres, such as copper or copper alloys, but also for hardly-joinable materials when soldering is performed using a solder composition including the flux. As described above, the flux is excellent in solder wettability on hardly-joinable base materials, and thus the content of the halogen-based activator included in the flux can be reduced or made zero. Such a flux can suppress occurrence of corrosion in a portion to be soldered. It is also preferable in terms of reducing the environmental load, since there is no risk of emissions of harmful substance such as dioxin at the time of disposal of soldered boards.

The flux according to this embodiment may further include at least one of a rosin-based resin and a synthetic resin in terms of improving solder wettability. The rosin-based resin is not particularly limited, and examples thereof include gum rosin, tall oil rosin, wood rosin, polymerized rosin, hydrogenated rosin, disproportionated rosin, acrylated rosin, rosin ester, and acid modified rosin. The synthetic resin is not particularly limited, and a known synthetic resin can be used. Among these, it is preferable to include one or more selected from hydrogenated rosin, acid modified rosin, and rosin ester, in terms of activating the flux. These may be individually used, or two or more of them may be used in combination.

The total content of the rosin-based resin and the synthetic resin is not particularly limited, but is, for example, preferably 20 to 99 parts by weight, more preferably 30 to 99 parts by weight, based on 100 parts by weight of the total of the flux. In particular, in the case where the flux according to this embodiment is used as a flux for a flux resin cored solder, the total content of the rosin-based resin and the synthetic resin is preferably 40 to 80 parts by weight, more preferably 50 to 70 parts by weight, based on 100 parts by weight of the total of the flux. In the case where one of the rosin-based resin and the synthetic resin is included, the content means the content of the one of the rosin-based resin and the synthetic resin.

The flux according to this embodiment may further include an organic acid-based activator in terms of reducing the environmental load. The organic acid-based activator is not particularly limited, and examples thereof include: a monocarboxylic acid such as formic acid, acetic acid, propionic acid, butyric acid, valeric acid, caproic acid, enanthic acid, capric acid, lauric acid, myristic acid, pentadecyl acid, palmitic acid, margaric acid, stearic acid, tuberculostearic acid, arachidic acid, behenic acid, lignoceric acid, and glycolic acid; a dicarboxylic acid such as oxalic acid, malonic acid, succinic acid, glutaric acid, adipic acid, pimeric acid, suberic acid, azelaic acid, sebacic acid, fumaric acid, maleic acid, tartaric acid, and diglycolic acid; and other organic acids such as dimer acid, levulinic acid, lactic acid, acrylic acid, benzoic acid, salicylic acid, anisic acid, citric acid, and picolinic acid. These may be individually used, or two or more of them may be used in combination.

The content of the organic acid-based activator is not particularly limited, but is, for example, preferably 0.1 part by weight or more, more preferably 0.3 part by weight or more, based on 100 parts by weight of the total of the flux. The content of the organic acid-based activator is preferably 10 parts by weight or less, more preferably 7 parts by weight or less, based on 100 parts by weight of the total of the flux.

In the case where two or more organic acid-based activators are included, the content means the total content of the organic acid-based activators.

Since the flux according to this embodiment further includes an organic acid-based activator, the content of a halogen-based activator included in the flux can be further reduced or made zero. Such a flux can further suppress occurrence of corrosion in a portion to be soldered. Further, it is more preferable in terms of reducing the environmental load, since there is no risk of emissions of harmful substance such as dioxin at the time of disposal of soldered boards.

The flux according to this embodiment may further include an amine-based compound in terms of improving solder wettability. The amine-based compound preferably has a cyclic structure in terms of further improving solder wettability. Examples of such an amine-based compound include an imidazole-based compound and a triazole-based compound. Among these, it is preferable to include an imidazole-based compound in terms of further improving solder wettability. Examples of the imidazole-based compound include benzimidazole, 2-methylimidazole, 2-ethylimidazole, 2-ethyl-4-methylimidazole (2E4MZ), 2-heptadecylimidazole, 2-undecylimidazole, 1-(4,6-diamino-s-triazine-2-yl)ethyl-2-undecylimidazole, and 1-butylimidazole. Examples of the triazole-based compound include benzotriazole, 1H-benzotriazole-1-methanol, and 1-methyl-1H-benzotriazole. Examples of other amine-based compounds include cetylamine, erucic acid amide, 3-(dimethylamino)-1,2-propanediol, 3,5-dimethylpyrazole, dimethylurea, hexahydro-1,3,5-triphenyl-1,3,5-triazine, pyrazinamide, N-phenylglycine, 3-methyl-5-pyrazolone, and N-lauroyl sarcosine. Among these, it is preferable to include 2-heptadecylimidazole in terms of improving solder wettability. These may be individually used, or two or more of them may be used in combination.

The content of the amine-based compound is preferably 0.5 to 10 parts by weight, more preferably 2 to 10 parts by weight, based on 100 parts by weight of the total of the flux, in terms of improving solder wettability. When the content of the amine-based compound is 10 parts by weight or less, the obtained solder composition can improve its preservation stability. In the case where two or more amine-based compounds are included, the content means the total content of the amine-based compounds.

The flux according to this embodiment can further improve solder wettability by a synergistic effect of the combined use of a phosphine oxide and an amine-based compound.

The flux according to this embodiment may include, for example, a solvent, a thixotropic agent, an antioxidant, a surfactant, a defoamer, and a corrosion inhibitor, as other additives.

The solvent is not particularly limited, and a known solvent can be used. Examples of the solvent include: glycol ethers such as diethylene glycol monohexyl ether (hexyl diglycol), diethylene glycol dibutyl ether (dibutyl diglycol), diethylene glycol mono 2-ethylhexyl ether (2 ethylhexyl diglycol), and diethylene glycol monobutyl ether (butyl diglycol); aliphatic compounds such as n-hexane, isohexane, and n-heptane; esters such as isopropyl acetate, methyl propionate, and ethyl propionate; ketones such as methyl ethyl ketone, methyl-n-propyl ketone, and diethyl ketone; and alcohols such as ethanol, n-propanol, isopropanol, and isobutanol. These may be individually used, or two or more of them may be used in combination.

The content of the solvent is not particularly limited, and is, for example, preferably 10 parts by weight or more, more preferably 20 parts by weight or more, based on 100 parts by weight of the total of the flux. The content of the solvent is preferably 60 parts by weight or less, more preferably 40 parts by weight or less, based on 100 parts by weight of the total of the flux. In the case where two or more of the solvents are included, the content means the total content of the solvents.

The thixotropic agent is not particularly limited, and examples thereof include hardened castor oil, amides, kaolin, colloidal silica, organic bentonite, and glass frit. These may be individually used, or two or more of them may be used in combination.

The content of the thixotropic agent is not particularly limited, and is, for example, preferably 1 part by weight or more, more preferably 2 parts by weight or more, still more preferably 3 parts by weight or more, based on 100 parts by weight of the total of the flux. The content of the thixotropic agent is preferably 10 parts by weight or less, more preferably 6 parts by weight or less, still more preferably 5 parts by weight or less, based on 100 parts by weight of the total of the flux. In the case where two or more thixotropic agents are included, the content means the total content of the thixotropic agents.

A method for producing the flux according to this embodiment is not particularly limited. For example, the aforementioned phosphine oxide and other additives, if necessary, are put into a heating container and heated to 160 to 180° C. to melt all the raw materials. They are finally cooled to room temperature to be thereby able to obtain the flux according to this embodiment.

<Resin Flux Cored Solder>

The resin flux cored solder according to this embodiment includes the aforementioned flux. More specifically, the resin flux cored solder is composed of a thin cylindrically-shaped solder alloy and the flux filled in the center of the solder alloy. It is preferable that the content of the flux is 1 to 5 parts by weight based on 100 parts by weight of the total of the resin flux cored solder.

The solder alloy is not particularly limited, and examples thereof include a lead-free solder alloy and a lead solder alloy. In terms of reducing the environmental load, a lead-free solder alloy is preferable. Examples of the lead-free solder alloy include an alloy including tin, silver, copper, indium, zinc, bismuth, antimony, or the like. More specifically, they include alloys of Sn/Ag, Sn/Ag/Cu, Sn/Cu, Sn/Ag/Bi, Sn/Bi, Sn/Ag/Cu/Bi, Sn/Sb, Sn/Zn/Bi, Sn/Zn, Sn/Zn/Al, Sn/Ag/Bi/In, Sn/Ag/Cu/Bi/In/Sb, In/Ag, or the like.

The resin flux cored solder according to this embodiment includes a flux having good solder wettability, and is thereby less likely to cause occurrence of failures such as poor formation of fillets, bridges between terminals, and formation of icicles.

<Solder Paste>

The solder paste according to this embodiment includes the aforementioned flux. More specifically, the solder paste is obtained by mixing solder alloy powder and the flux. The content of the flux is preferably 5 to 20 parts by weight based on 100 parts by weight of the total of the solder paste. The content of the solder alloy powder is preferably 80 to 95 parts by weight based on 100 parts by weight of the total of the solder paste. As a solder alloy in the solder alloy powder, an alloy similar to the solder alloy included in the resin flux cored solder can be used.

The solder paste according to this embodiment includes a flux having good solder wettability, and thus, similar to the resin flux cored solder including the flux, is less likely to cause occurrence of failures such as solder dewetting on a hardly-joinable base material or a part in which a hardly-joinable material is used for a lead part or the like.

The flux, the resin flux cored solder, and the solder paste according to this embodiment can be suitably used also on a hardly-joinable base material. The hardly-joinable base material herein refers to a metallic material that is difficult to be soldered, such as 42 Alloy (Fe-42Ni), Kovar (Fe-29Ni-17Co), or iron.

Examples

Hereinafter, examples of the present invention will be described. However, the present invention is not limited to the following examples.

Flux

<Production of Flux>

Raw materials in mixing amounts shown in Tables 1 and 2 were put into a heating container and heated to 180° C. to melt all the raw materials. Thereafter, they were cooled to room temperature to obtain uniformly dispersed fluxes of Examples 1 to 30 and Comparative Example 1. Each mixing amount shown in Tables 1 and 2 is equal to the content of each component included in a flux.

TABLE 1

| | | | Example | | | | | | | | | | |
|---|---|---|---|---|---|---|---|---|---|---|---|---|---|
| | | | 1 | 2 | 3 | 4 | 5 | 6 | 7 | 8 | 9 | 10 |
| Mixing amount (parts by weight) | Rosin-based resin | KR-610 | 10.0 | 10.0 | 10.0 | 10.0 | 10.0 | 10.0 | 10.0 | 10.0 | 10.0 | 10.0 |
| | | KE-604 | 70.0 | 69.5 | 67.5 | 65.5 | 63.5 | 60.5 | 65.5 | 65.5 | 65.5 | 65.5 |
| | | KE-359 | 15.0 | 15.0 | 15.0 | 15.0 | 15.0 | 15.0 | 15.0 | 15.0 | 15.0 | 15.0 |
| | Organic acid-based activator | Adipic acid | 1.5 | 1.5 | 1.5 | 1.5 | 1.5 | 1.5 | 1.5 | 1.5 | 1.5 | 1.5 |
| | | Azelaic acid | 3.0 | 3.0 | 3.0 | 3.0 | 3.0 | 3.0 | 3.0 | 3.0 | 3.0 | 3.0 |
| | Phosphine oxide | TPPO | 0.5 | 1.0 | 3.0 | 5.0 | 7.0 | 10.0 | — | — | — | 3.0 |
| | | BAPO | — | — | — | — | — | — | 5.0 | — | — | — |
| | | TMDPO | — | — | — | — | — | — | — | 5.0 | — | — |
| | | TOPO | — | — | — | — | — | — | — | — | 5.0 | — |
| | Amine-based compound | C17Z | — | — | — | — | — | — | — | — | — | 2.0 |
| | | C11Z | — | — | — | — | — | — | — | — | — | — |
| | | C11Z-A | — | — | — | — | — | — | — | — | — | — |
| | | Amine Pb | — | — | — | — | — | — | — | — | — | — |
| | | Neutron S | — | — | — | — | — | — | — | — | — | — |
| | | 1-butylimidazole | — | — | — | — | — | — | — | — | — | — |
| | | 3-(dimethylamino)-1,2-propanediol | — | — | — | — | — | — | — | — | — | — |
| | | 3,5-dimethylpyrazole | — | — | — | — | — | — | — | — | — | — |

TABLE 1-continued

| | | | | | | | | | | | | |
|---|---|---|---|---|---|---|---|---|---|---|---|---|
| | | Dimethylurea | — | — | — | — | — | — | — | — | — | — |
| | | Hexahydro-1,3,5-triphenyl-1,3,5-triazine | — | — | — | — | — | — | — | — | — | — |
| | | Pyrazinamide | — | — | — | — | — | — | — | — | — | — |
| | | N-Phenylglycine | — | — | — | — | — | — | — | — | — | — |
| | | 3-methyl-5-pyrazolone | — | — | — | — | — | — | — | — | — | — |
| | | Sarcosinate LH | — | — | — | — | — | — | — | — | — | — |
| | | Total | 100 | 100 | 100 | 100 | 100 | 100 | 100 | 100 | 100 | 100 |
| | Wettability evaluation; Spreading ratio (%) | | 57.6 | 55.2 | 57.5 | 58.6 | 62.7 | 63.0 | 60.2 | 61.6 | 57.1 | 65.2 |

| | | | Example | | | | | | |
|---|---|---|---|---|---|---|---|---|---|
| | | | 11 | 12 | 13 | 14 | 15 | 16 | 17 |
| Mixing amount (parts by weight) | Rosin-based resin | KR-610 | 10.0 | 10.0 | 10.0 | 10.0 | 10.0 | 10.0 | 10.0 |
| | | KE-604 | 63.5 | 61.5 | 58.5 | 65.0 | 64.6 | 60.5 | 55.5 |
| | | KE-359 | 15.0 | 15.0 | 15.0 | 15.0 | 15.0 | 15.0 | 15.0 |
| | Organic acid-based activator | Adipic acid | 1.5 | 1.5 | 1.5 | 1.5 | 1.5 | 1.5 | 1.5 |
| | | Azelaic acid | 3.0 | 3.0 | 3.0 | 3.0 | 3.0 | 3.0 | 3.0 |
| | Phosphine oxide | TPPO | 5.0 | 7.0 | 10.0 | 5.0 | 5.0 | 5.0 | 5.0 |
| | | BAPO | — | — | — | — | — | — | — |
| | | TMDPO | — | — | — | — | — | — | — |
| | | TOPO | — | — | — | — | — | — | — |
| | Amine-based compound | C17Z | 2.0 | 2.0 | 2.0 | 0.5 | 1.0 | 5.0 | 10.0 |
| | | C11Z | — | — | — | — | — | — | — |
| | | C11Z-A | — | — | — | — | — | — | — |
| | | Amine Pb | — | — | — | — | — | — | — |
| | | Neutron S | — | — | — | — | — | — | — |
| | | 1-butylimidazole | — | — | — | — | — | — | — |
| | | 3-(dimethylamino)-1,2-propanediol | — | — | — | — | — | — | — |
| | | 3,5-dimethylpyrazole | — | — | — | — | — | — | — |
| | | Dimethylurea | — | — | — | — | — | — | — |
| | | Hexahydro-1,3,5-triphenyl-1,3,5-triazine | — | — | — | — | — | — | — |
| | | Pyrazinamide | — | — | — | — | — | — | — |
| | | N-Phenylglycine | — | — | — | — | — | — | — |
| | | 3-methyl-5-pyrazolone | — | — | — | — | — | — | — |
| | | Sarcosinate LH | — | — | — | — | — | — | — |
| | | Total | 100 | 100 | 100 | 100 | 100 | 100 | 100 |
| | Wettability evaluation; Spreading ratio (%) | | 66.2 | 67.6 | 67.7 | 59.5 | 63.7 | 68.3 | 68.3 |

TABLE 2

| | | | Example | | | | | | | |
|---|---|---|---|---|---|---|---|---|---|---|
| | | | 18 | 19 | 20 | 21 | 22 | 23 | 24 | 25 |
| Mixing amount (parts by weight) | Rosin-based resin | KR-610 | 10.0 | 10.0 | 10.0 | 10.0 | 10.0 | 10.0 | 10.0 | 10.0 |
| | | KE-604 | 63.5 | 63.5 | 63.5 | 63.5 | 63.5 | 63.5 | 63.5 | 63.5 |
| | | KE-359 | 15.0 | 15.0 | 15.0 | 15.0 | 15.0 | 15.0 | 15.0 | 15.0 |
| | Organic acid-based activator | Adipic acid | 1.5 | 1.5 | 1.5 | 1.5 | 1.5 | 1.5 | 1.5 | 1.5 |
| | | Azelaic acid | 3.0 | 3.0 | 3.0 | 3.0 | 3.0 | 3.0 | 3.0 | 3.0 |
| | Phosphine oxide | TPPO | 5.0 | 5.0 | 5.0 | 5.0 | 5.0 | 5.0 | 5.0 | 5.0 |
| | | BAPO | — | — | — | — | — | — | — | — |
| | | TMDPO | — | — | — | — | — | — | — | — |
| | | TOPO | — | — | — | — | — | — | — | — |
| | Amine-based compound | C17Z | — | — | — | — | — | — | — | — |
| | | C11Z | 2.0 | — | — | — | — | — | — | — |
| | | C11Z-A | — | 2.0 | — | — | — | — | — | — |
| | | Amine Pb | — | — | 2.0 | — | — | — | — | — |
| | | Neutron S | — | — | — | 2.0 | — | — | — | — |
| | | 1-butylimidazole | — | — | — | — | 2.0 | — | — | — |
| | | 3-(dimethylamino)-1,2-propanediol | — | — | — | — | — | 2.0 | — | — |
| | | 3,5-dimethylpyrazole | — | — | — | — | — | — | 2.0 | — |
| | | Dimethylurea | — | — | — | — | — | — | — | 2.0 |
| | | Hexahydro-1,3,5-triphenyl-1,3,5-triazine | — | — | — | — | — | — | — | — |
| | | Pyrazinamide | — | — | — | — | — | — | — | — |
| | | N-Phenylglycine | — | — | — | — | — | — | — | — |
| | | 3-methyl-5-pyrazolone | — | — | — | — | — | — | — | — |
| | | Sarcosinate LH | — | — | — | — | — | — | — | — |
| | | Total | 100 | 100 | 100 | 100 | 100 | 100 | 100 | 100 |
| | Wettability evaluation; Spreading ratio (%) | | 66.1 | 67.6 | 67.8 | 59.2 | 68.2 | 68.9 | 63.2 | 62.2 |

TABLE 2-continued

| | | | Example | | | | | C. Ex. |
|---|---|---|---|---|---|---|---|---|
| | | | 26 | 27 | 28 | 29 | 30 | 1 |
| Mixing amount (parts by weight) | Rosin-based resin | KR-610 | 10.0 | 10.0 | 10.0 | 10.0 | 10.0 | 10.0 |
| | | KE-604 | 63.5 | 63.5 | 63.5 | 63.5 | 63.5 | 70.5 |
| | | KE-359 | 15.0 | 15.0 | 15.0 | 15.0 | 15.0 | 15.0 |
| | Organic acid-based activator | Adipic acid | 1.5 | 1.5 | 1.5 | 1.5 | 1.5 | 1.5 |
| | | Azelaic acid | 3.0 | 3.0 | 3.0 | 3.0 | 3.0 | 3.0 |
| | Phosphine oxide | TPPO | 5.0 | 5.0 | 5.0 | 5.0 | 5.0 | — |
| | | BAPO | — | — | — | — | — | — |
| | | TMDPO | — | — | — | — | — | — |
| | | TOPO | — | — | — | — | — | — |
| | Amine-based compound | C17Z | — | — | — | — | — | — |
| | | C11Z | — | — | — | — | — | — |
| | | C11Z-A | — | — | — | — | — | — |
| | | Amine Pb | — | — | — | — | — | — |
| | | Neutron S | — | — | — | — | — | — |
| | | 1-butylimidazole | — | — | — | — | — | — |
| | | 3-(dimethylamino)-1,2-propanediol | — | — | — | — | — | — |
| | | 3,5-dimethylpyrazole | — | — | — | — | — | — |
| | | Dimethylurea | — | — | — | — | — | — |
| | | Hexahydro-1,3,5-triphenyl-1,3,5-triazine | 2.0 | — | — | — | — | — |
| | | Pyrazinamide | — | 2.0 | — | — | — | — |
| | | N-Phenylglycine | — | — | 2.0 | — | — | — |
| | | 3-methyl-5-pyrazolone | — | — | — | 2.0 | — | — |
| | | Sarcosinate LH | — | — | — | — | 2.0 | — |
| | | Total | 100 | 100 | 100 | 100 | 100 | 100 |
| Wettability evaluation; Spreading ratio (%) | | | 66.9 | 58.2 | 58.1 | 57.8 | 58.5 | 51.5 |

Details of each of the raw materials shown in Tables 1 and 2 are shown below.
(Rosin-Based Resin)
KR-610: Hydrogenated rosin, product name "KR-610" manufactured by ARAKAWA CHEMICAL INDUSTRIES, LTD.
KE-604: Acid-modified rosin, product name "KE-604" manufactured by ARAKAWA CHEMICAL INDUSTRIES, LTD.
KE-359: Ultra-pale rosin ester, product name "KE-359" manufactured by ARAKAWA CHEMICAL INDUSTRIES, LTD.
(Organic Acid-Based Activator)
Adipic acid: Manufactured by Sumitomo Chemical Industry Company Limited
Azelaic acid: Manufactured by CHUGAI CHEMICAL INDUSTRIAL CO., LTD.
(Phosphine Oxide)
TPPO: Triphenylphosphine oxide manufactured by Tokyo Chemical Industry Co., Ltd.
BAPO: Phenylbis(2,4,6-trimethylbenzoyl) phosphine oxide manufactured by Tokyo Chemical Industry Co., Ltd.
TMDPO: Diphenyl (2,4,6-trimethylbenzoyl) phosphine oxide manufactured by Tokyo Chemical Industry Co., Ltd.
TOPO: Tri-n-octylphosphine oxide manufactured by Tokyo Chemical Industry Co., Ltd.
(Amine-Based Compound)
C17Z: 2-heptadecylimidazole manufactured by SHIKOKU CHEMICALS CORPORATION
C11Z: 2-undecylimidazole manufactured by SHIKOKU CHEMICALS CORPORATION
C11Z-A: 1-(4,6-diamino-s-triazine-2-yl)ethyl-2-undecylimidazole manufactured by SHIKOKU CHEMICALS CORPORATION
Amine Pb: Cetylamine manufactured by NOF CORPORATION
Neutron S: Erucic acid amide manufactured by NIPPON FINE CHEMICAL CO., LTD.
1-butylimidazole: Manufactured by Tokyo Chemical Industry Co., Ltd.
3-(dimethylamino)-1,2-propanediol: Manufactured by Tokyo Chemical Industry Co., Ltd.
3,5-dimethylpyrazole: Manufactured by Tokyo Chemical Industry Co., Ltd.
Dimethylurea: Manufactured by Tokyo Chemical Industry Co., Ltd.
Hexahydro-1,3,5-triphenyl-1,3,5-triazine: Manufactured by Tokyo Chemical Industry Co., Ltd.
Pyrazinamide: Manufactured by Tokyo Chemical Industry Co., Ltd.
N-phenylglycine: Manufactured by Tokyo Chemical Industry Co., Ltd.
3-methyl-5-pyrazolone: Manufactured by Tokyo Chemical Industry Co., Ltd.
Sarcosinate LH: N-lauroyl sarcosine, manufactured by Nikko Chemicals Co., Ltd.

<Wettability Evaluation>

The wettability of the fluxes of Examples 1 to 30 and Comparative Example 1 was evaluated by calculating the spreading ratio of each of the fluxes using the method below.

A thread solder (solder alloy: SAC305 (96.5 mass % of Sn, 3.0 mass % of Ag, and 0.5 mass % of Cu) with a length of about 5.6 mm and a diameter of 0.8 mm) formed into a 1.6-mm diameter ring was placed on a degreased and cleaned 42 Alloy board (30 mm×30 mm×0.3 mm-thick), and a piece (about 10 mg) of each of the fluxes was put on the ring-shaped solder, to produce a test piece.

Each test piece was placed on a solder bath heated to 260° C., to melt the thread solder. After a lapse of 5 seconds from the melting, the test piece was detached from the solder bath.

Each test piece was washed with isopropyl alcohol, and the height of each test piece was measured using a micrometer (manufactured by MITUTOYO CORPORATION).

Then, the spreading ratio was obtained using the following calculation formula. The obtained results are shown in Tables 1 and 2.

Spreading ratio (%)=100×(D−H)/D

H: Height of solder={Thickness of test piece after test}−{Thickness of board before test (=0.3 mm)}

D: Diameter of thread solder (mm) used for the test in the case where it is regarded as a sphere=2.2 (mm)

As shown in Tables 1 and 2, Examples 1 to 30 satisfying all the constitutional requirements of the present invention have higher spreading ratios than Comparative Example 1, which indicate their good wettability. Among Examples 1 to 30, Examples 10 to 30 further including an amine-based compound have higher spreading ratios, which indicate their better wettability.

[Solder Paste]
<Production of Flux>

Raw materials in mixing amounts shown in Table 3 were put into a heating container and heated to 180° C. to melt all the raw materials. Thereafter, they were cooled to room temperature to obtain uniformly dispersed fluxes of Example 31 and Comparative Example 2. Each mixing amount shown in Table 3 is equal to the content of each component included in a flux.

TABLE 3

| | | | Ex. 31 | C. Ex. 2 |
|---|---|---|---|---|
| Mixing amount (parts by weight) | Rosin-based resin | KR-610 | 32.3 | 35.1 |
| | | KE-604 | 4.1 | 4.5 |
| | | KE-359 | 4.1 | 4.5 |
| | Organic acid-based activator | Adipic acid | 1.5 | 1.5 |
| | | Azelaic acid | 3.0 | 3.1 |
| | Phosphine oxide | TPPO | 5.0 | — |
| | Amine-based compound | C17Z | 2.0 | — |
| | Solvent | HeDG | 41.0 | 44.5 |
| | Thixotropic agent | Slipax ZHH | 7.0 | 7.0 |
| | Total | | 100 | 100 |
| Wettability evaluation: Dewetting test | | | ○ | x |

Details of each of the raw materials shown in Table 3 are shown below.
(Rosin-Based Resin)
KR-610: Hydrogenated rosin, product name "KR-610" manufactured by ARAKAWA CHEMICAL INDUSTRIES, LTD.
KE-604: Acid-modified rosin, product name "KE-604" manufactured by ARAKAWA CHEMICAL INDUSTRIES, LTD.
KE-359: Ultra-pale rosin ester, product name "KE-359" manufactured by ARAKAWA CHEMICAL INDUSTRIES, LTD.
(Organic Acid-Based Activator)
Adipic acid: Manufactured by Sumitomo Chemical Industry Company Limited
Azelaic acid: Manufactured by CHUGAI CHEMICAL INDUSTRIAL CO., LTD.
(Phosphine Oxide)
TPPO: Triphenylphosphine oxide manufactured by Tokyo Chemical Industry Co., Ltd.
(Amine-Based Compound)
C17Z: 2-heptadecylimidazole manufactured by SHIKOKU CHEMICALS CORPORATION
(Solvent)
HeDG: Hexyl diglycol manufactured by Nippon Nyukazai Co., Ltd.
(Thixotropic Agent)
Slipax ZHH: Hexamethylene hydroxystearine acid amide manufactured by Nihon Kasei CO., LTD.
<Wettability Evaluation>

The wettability of the solder pastes respectively including the fluxes of Example 31 and Comparative Example 2 was evaluated by a dewetting test based on JIS Z 3284-4. The respective solder pastes were obtained by mixing the respective fluxes with solder alloy powder (SAC305: 96.5 mass % of Sn, 3.0 mass % of Ag, and 0.5 mass % of Cu). The content of each flux was 11 parts by weight based on 100 parts by weight of the total of the each solder paste. A 42 Alloy board (30 mm×30 mm×0.3 mm-thick) that was degreased and cleaned was used as a board.

As a result of the dewetting test, the flux in which the degree of spreading according to JIS Z 3284-4 was 1 or 2 was evaluated as "○" while the flux in which the degree of spreading was 3 or 4 was evaluated as "x". The evaluation results are shown in Table 3.

As shown in Table 3, Example 31 satisfying all the constitutional requirements of the present invention causes no solder dewetting while Comparative Example 2 causes solder dewetting, which indicates that Example 31 has good wettability.

The invention claimed is:

1. A flux used for soldering, the flux comprising a phosphine oxide and a solvent, wherein the content of the phosphine oxide is 0.5 to 10 parts by weight based on 100 parts by weight of a total of the flux, and the phosphine oxide is at least one selected from triphenylphosphine oxide and tri-n-octylphosphine oxide.

2. The flux according to claim 1, further comprising at least one of a rosin-based resin and a synthetic resin.

3. The flux according to claim 2, further comprising an organic acid-based activator.

4. The flux according to claim 3, wherein the phosphine oxide is triphenylphosphine oxide.

5. The flux according to claim 2, wherein the phosphine oxide is triphenylphosphine oxide.

6. The flux according to claim 1, further comprising an organic acid-based activator.

7. The flux according to claim 6, wherein the phosphine oxide is triphenylphosphine oxide.

8. The flux according to claim 1, wherein the phosphine oxide is triphenylphosphine oxide.

9. The flux according to claim 1, further comprising an amine-based compound.

10. The flux according to claim 9, wherein the content of the amine-based compound is 0.5 to 10 parts by weight based on 100 parts by weight of the total of the flux.

11. The flux according to claim 9, wherein the amine-based compound has a cyclic structure.

12. The flux according to claim 11, wherein the amine-based compound is an imidazole-based compound.

13. A resin flux cored solder comprising the flux according to claim 1.

14. A solder paste comprising the flux according to claim 1.

* * * * *